US012165987B2

(12) United States Patent
Kloster et al.

(10) Patent No.: US 12,165,987 B2
(45) Date of Patent: Dec. 10, 2024

(54) FRAME REVEALS WITH MASKLESS LITHOGRAPHY IN THE MANUFACTURE OF INTEGRATED CIRCUITS

(71) Applicant: Intel Corporation, Santa Clara, CA (US)

(72) Inventors: Grant Kloster, Lake Oswego, OR (US); Robert Bristol, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 755 days.

(21) Appl. No.: 17/105,416

(22) Filed: Nov. 25, 2020

(65) Prior Publication Data

US 2022/0165677 A1 May 26, 2022

(51) Int. Cl.
*H01L 23/544* (2006.01)
*H01L 21/027* (2006.01)
*H01L 23/528* (2006.01)

(52) U.S. Cl.
CPC ........ *H01L 23/544* (2013.01); *H01L 21/0274* (2013.01); *H01L 23/5283* (2013.01); *H01L 2223/54426* (2013.01)

(58) Field of Classification Search
CPC ............... H01L 23/544; H01L 23/5283; H01L 21/0274; H01L 2223/54426; H01L 2223/5446; G03F 7/2051; G03F 7/2059; G03F 9/708; G03F 9/7084; G03F 9/7076
See application file for complete search history.

(56) References Cited

U.S. PATENT DOCUMENTS

| 5,917,588 A * | 6/1999 | Addiego ............ G01N 21/8806 356/237.2 |
| 10,026,589 B1 * | 7/2018 | Monahan ............... H01J 37/265 |
| 2002/0083280 A1 * | 6/2002 | Naitoh .................. G06F 1/3203 711/158 |
| 2005/0186753 A1 | 8/2005 | Chen et al. |
| 2006/0017180 A1 | 1/2006 | Sarma |

(Continued)

OTHER PUBLICATIONS

Y.M. Ham et al., "Dependence of Defects in Optical Lithography," Dec. 1992, Jpn J. Appl. Phys vol. 31 pp. 4137-4142. (Year: 1992).*

(Continued)

*Primary Examiner* — Herve-Louis Y Assouman
*Assistant Examiner* — Linda J. Fleck
(74) *Attorney, Agent, or Firm* — Essential Patents Group, LLP

(57) ABSTRACT

Integrated circuitry comprising an opaque material layer, such an interconnect metallization layer is first patterned with a maskless lithography to reveal an alignment feature, and is then patterned with masked lithography that aligns to the alignment feature. In some examples, the maskless lithography employs an I-line digital light processing (DLP) lithography system. In some examples the I-line DLP lithography system performs an alignment with IR illumination through a backside of a wafer. The maskless pattern may include dimensionally large windows within a frame around circuitry regions. A first etch of the opaque material layer may expose the alignment feature within the window, and a second etch of the opaque material may form IC features, such as interconnect metallization features.

19 Claims, 12 Drawing Sheets

(56) References Cited

U.S. PATENT DOCUMENTS

| | | |
|---|---|---|
| 2007/0275520 A1 | 11/2007 | Suzuki |
| 2016/0172306 A1* | 6/2016 | Scanlan .............. H01L 23/3114 |
| | | 438/462 |
| 2017/0200716 A1 | 7/2017 | Or-Bach et al. |
| 2018/0138396 A1 | 5/2018 | Nagel |
| 2019/0235394 A1 | 8/2019 | Plug et al. |

OTHER PUBLICATIONS

Semiconductor Equipment and Materials International "SEMI Draft Document 5473 New Standard: Guide for Alignment Mark for 3DS-IC Process" Document No. 5473, May 24, 2013 (Year: 2013).*

K. Best, et al., "Photolithography Alignment Mark Transfer System for Low Cost Advanced Packaging and Bonded Wafer Applications" IMAPS 2016—49th International Symposium on Microelectronics—Pasadena, CA USA—Oct. 10-13, 2016, pp. 315-320. (Year: 2016).*

Notice of Allowance from European Patent Application No. 21198876.1 notified Jul. 4, 2023, 8 pgs.

Extended European Search Report from European Patent Application No. 21198876.1 notified Mar. 25, 2022, 9 pgs.

* cited by examiner

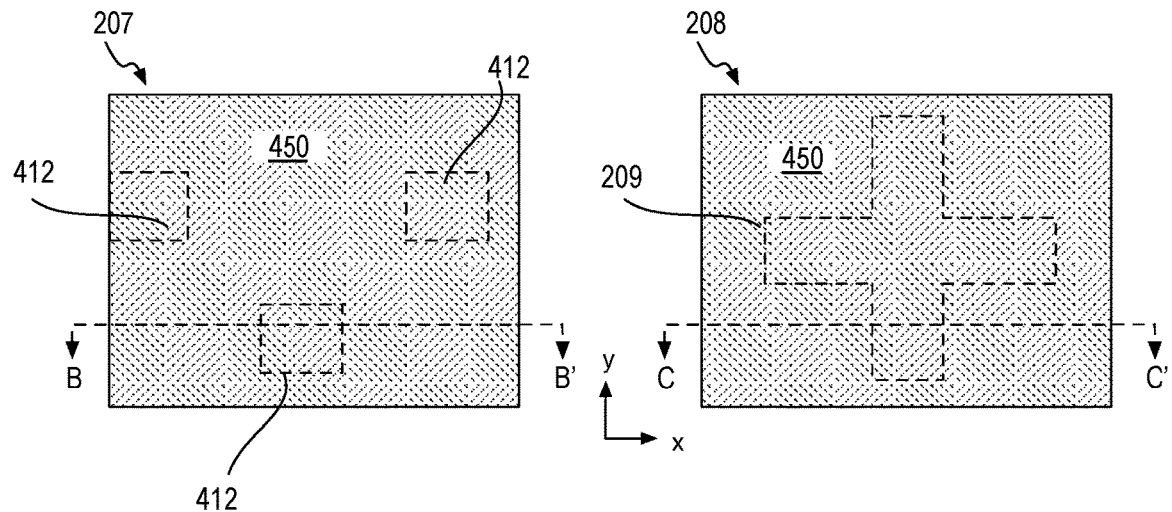
FIG. 4A
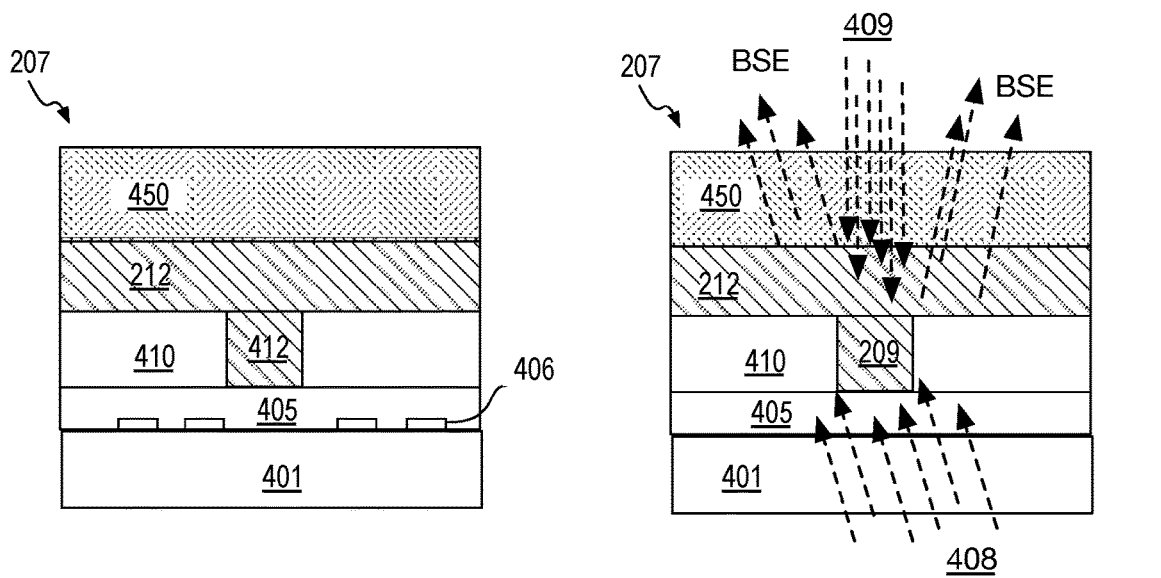
FIG. 4B
FIG. 4C

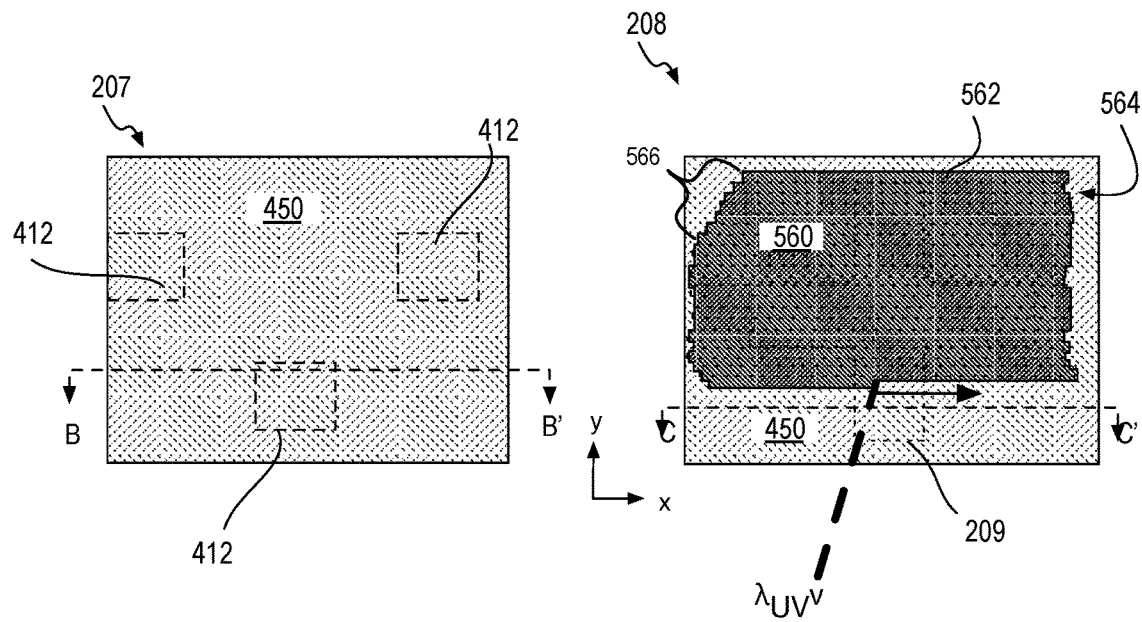
FIG. 5A
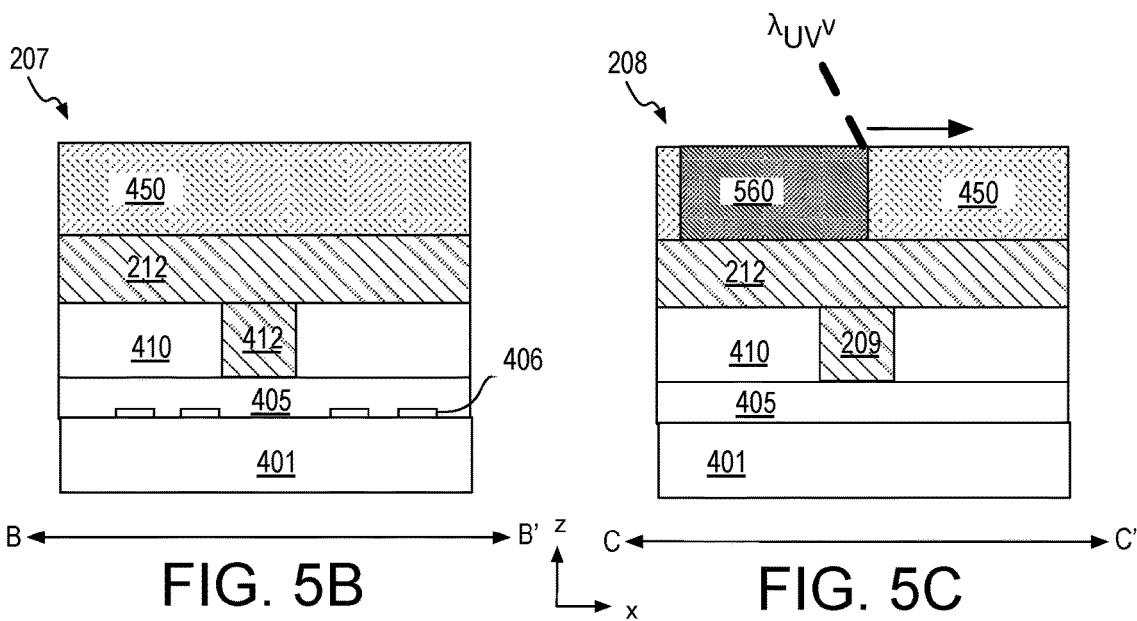
FIG. 5B
FIG. 5C

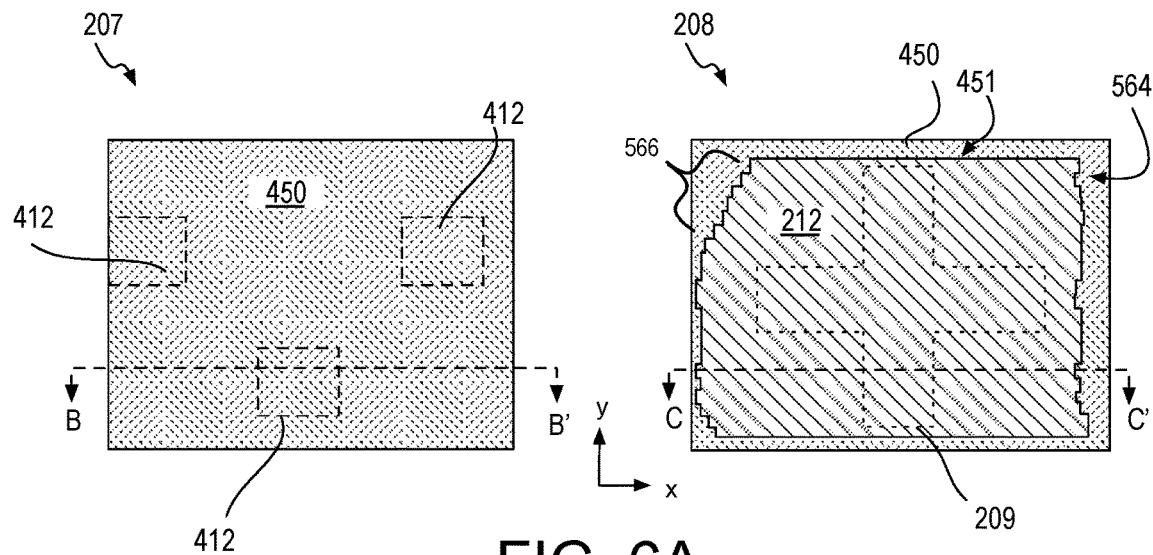
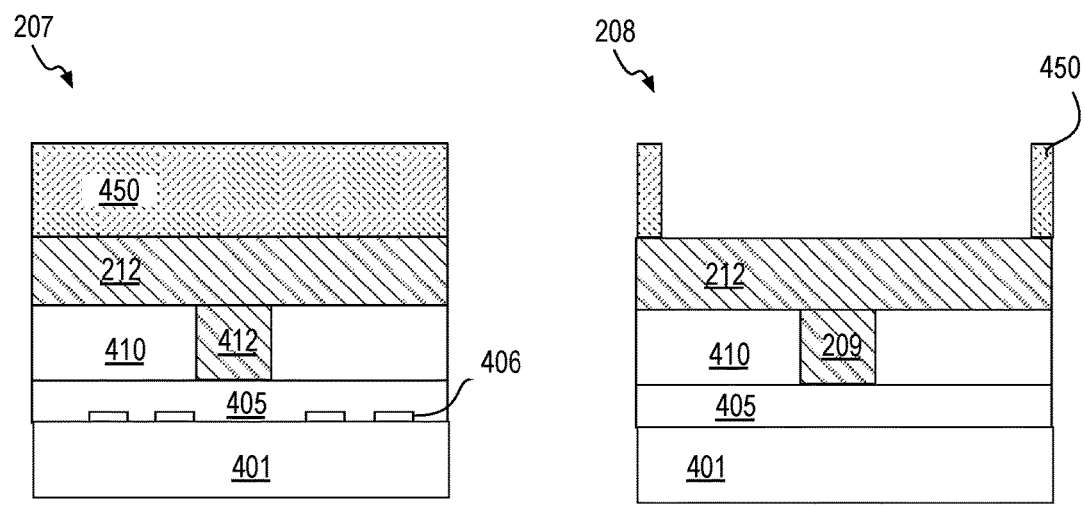
FIG. 6A
FIG. 6B
FIG. 6C

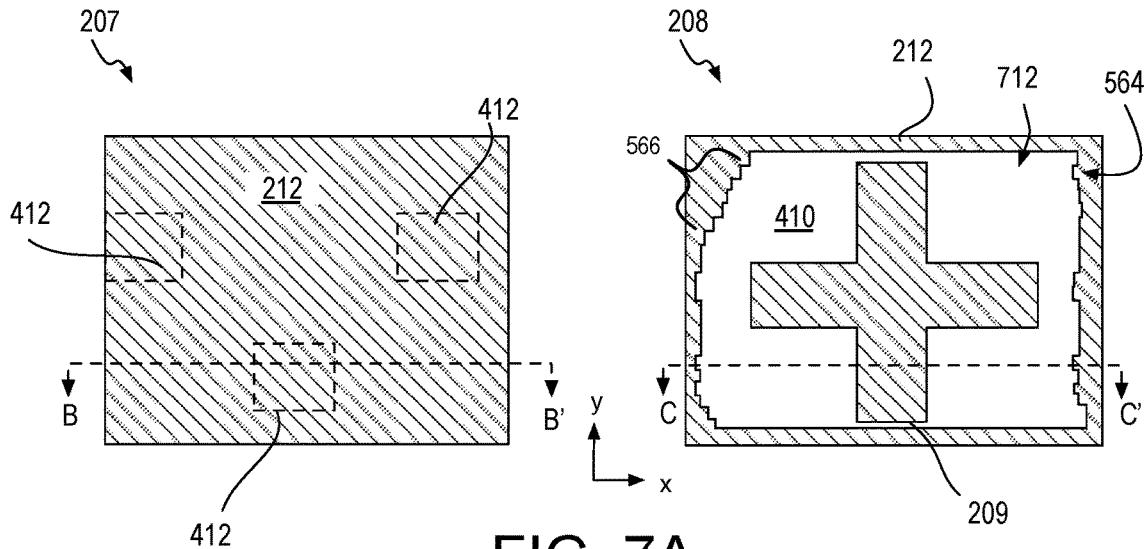
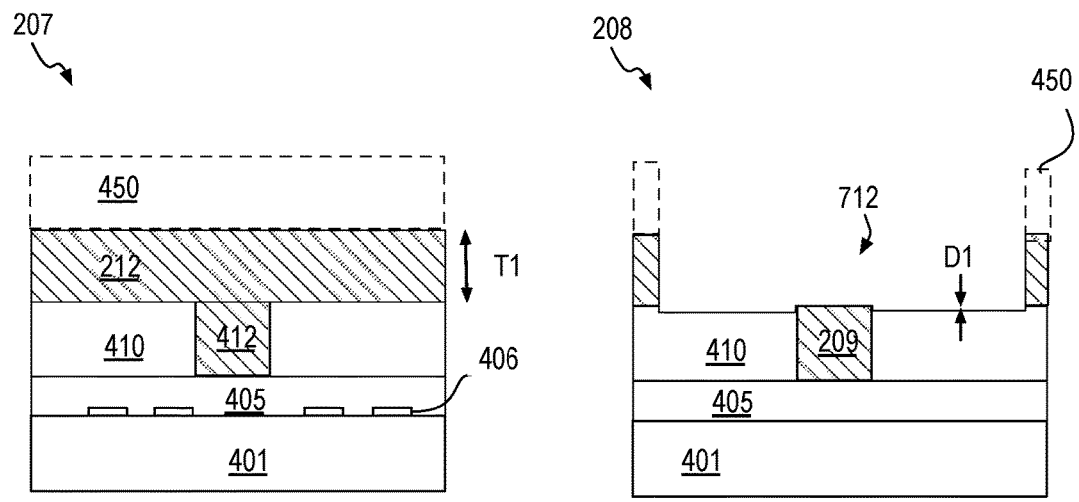
FIG. 7A
FIG. 7B
FIG. 7C

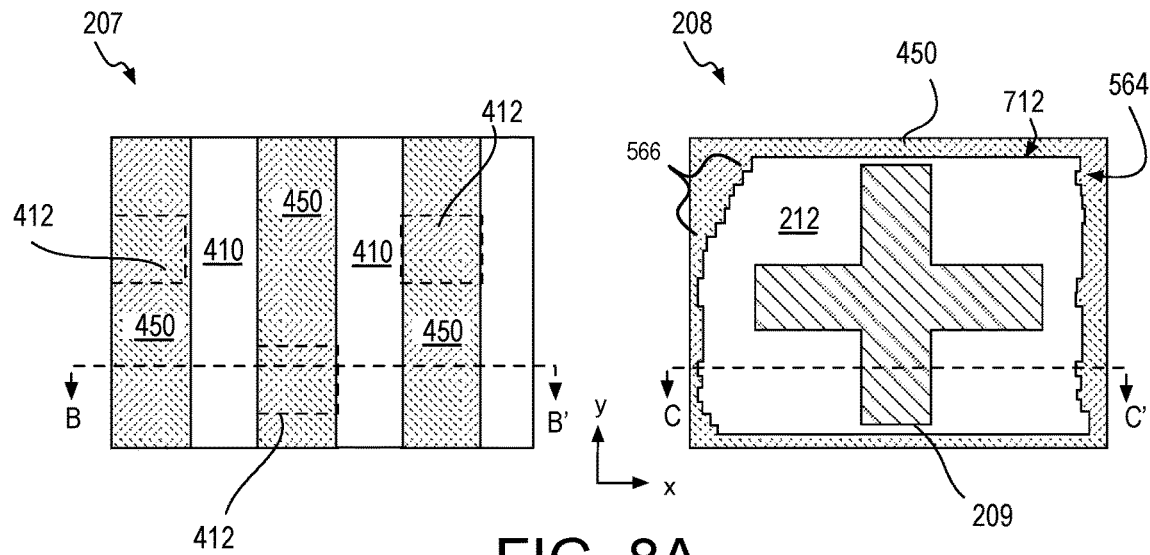
FIG. 8A
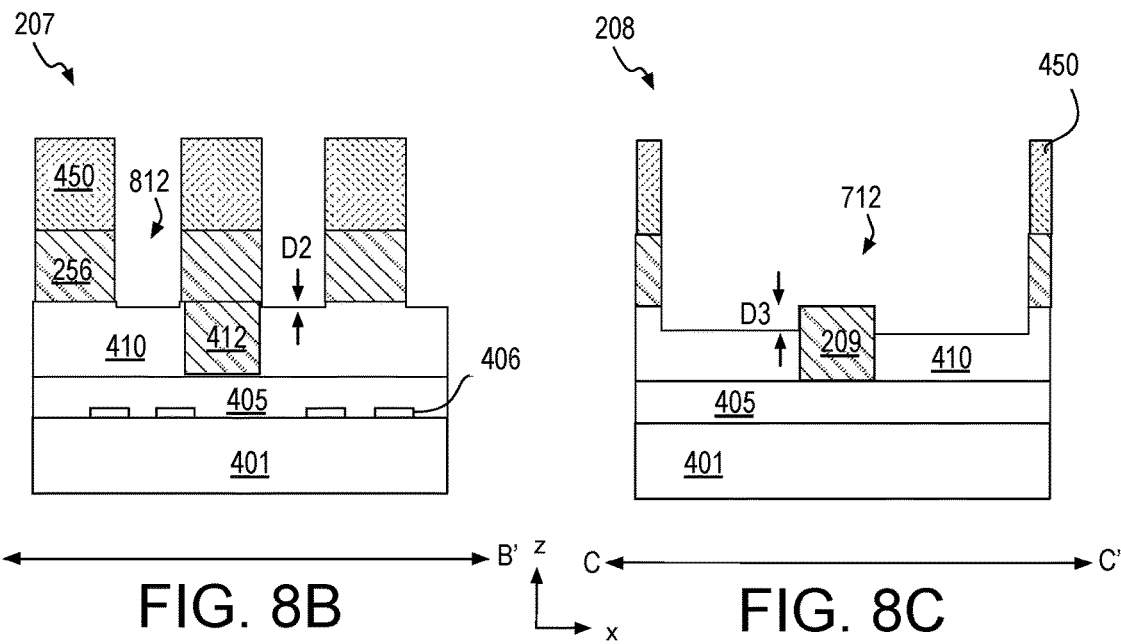
FIG. 8B
FIG. 8C

FRAME REVEALS WITH MASKLESS LITHOGRAPHY IN THE MANUFACTURE OF INTEGRATED CIRCUITS

BACKGROUND

Demand for higher performance integrated circuits (ICs) in electronic device applications has motivated increasingly dense transistor architectures. Interconnect parasitics become a greater challenge as the density of interconnect structures keeps pace with transistor density. For example, the resistance-capacitance (RC) delay associated with interconnects of an IC increases with the density of the interconnects.

With damascene IC interconnect technology, fill metal (e.g., Cu) is deposited (e.g. electrochemically plated). In duel-damascene techniques, both a via opening and an overlying trench are etched into dielectric materials, and then filled with metal concurrently. Via opening and/or trench aspect ratios (e.g., depth: width) increase with greater device density. The act of filling a via opening with conductive material(s) becomes increasingly difficult as the aspect ratio of via increases. To combat excessive aspect ratios, via openings and trenches may be patterned and filled separately according to a single-damascene technique.

As the pitch of interconnect features continues to shrink, new fabrication techniques and interconnect structural architectures will be needed to overcome the limitations associated with filling topographic features of greater aspect ratios with conductive material. One such technique is subtractive patterning of interconnect features. In subtractive patterning, an interconnect material (e.g., a metal) is deposited and then features (e.g., lines or vias) are patterned (e.g., etched) into the interconnect material.

In contrast to subtractive interconnect line patterning practiced in IC manufacture decades ago where an interconnect material layer was non-planar and decorated significant underlying topography, interconnect material layers will need to be deposited upon underlying material (e.g., dielectric) surfaces that have been highly planarized. An interconnect material layer will therefore be of a highly uniform thickness and have a featureless, planarized surface. Because many materials suitable for interconnects have poor transmission (e.g., substantially opaque) within the optical wavelength bands employed in nanometer lithography (e.g., 193 nm, immersion, or EUV), the featureless, planarized surface of an interconnect material layer poses a new challenge to the lithographic patterning of an overlying photosensitive mask material. In particular, it is difficult to align lithographically defined photoresist mask features to IC features underlying the interconnect material layer if a lithography system cannot locate any underlying alignment and/or registration marks.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 4A, 5A, 6A, 7A and 8A are top-down plan views of an circuitry region and a frame region of a wafer evolving as blocks in the methods introduced in FIG. 3 are practiced in accordance with some embodiments;

FIGS. 4B, 5B, 6B, 7B and 8B are cross-sectional views of a circuitry region of a wafer evolving as blocks in the methods introduced in FIG. 3 are practiced in accordance with some embodiments;

FIGS. 4C, 5C, 6C, 7C and 8C are cross-sectional views of a frame region of a wafer evolving as blocks in the methods introduced in FIG. 3 are practiced in accordance with some embodiments;

DETAILED DESCRIPTION

Figure 1:
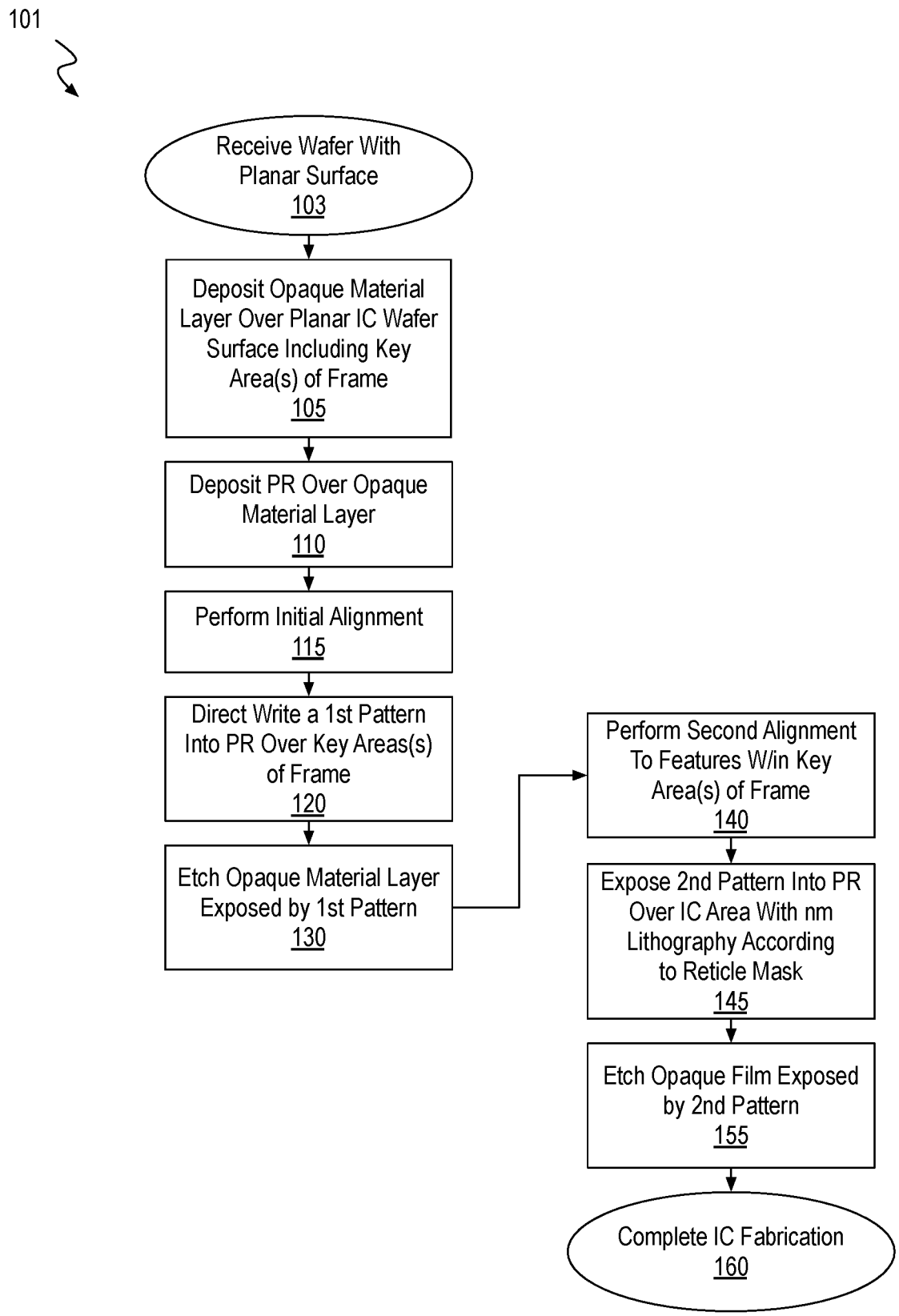
FIG. 1 is a flow diagram illustrating methods of subtractively patterning an opaque material layer with a maskless reveal of key areas of a frame, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct physical contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

FIG. 1 is a flow diagram illustrating methods 101 for subtractively patterning an opaque material layer that includes a maskless reveal of key areas of a frame, in accordance with some embodiments. Methods 101 may be practiced in the fabrication of an integrated circuit (IC) whenever a substantially opaque and featureless material layer is to be subtractively patterned into IC structural features aligned with underlying structural features of the IC. The practice of methods 101 may be particularly advantageous when the lithographic system that is to define a nanometer resolution mask for the subtractive patterning process is unable to align to the underlying IC features with sufficient precision, for example because the optical wavelength employed in the alignment process has poor transmission through the material layer to be patterned (i.e., the featureless material layer to be patterned is substantially opaque to the lithographic alignment system). FIG. 2A-2D are plan views of a wafer evolving during the practice of the methods 101, in accordance with some embodiments.

Referring first to FIG. 1, methods 101 begin at input 103 where an IC workpiece is received. In some embodiments the workpiece is as a large format (e.g., 300-450 mm) wafer. The wafer may include a Group IV semiconductor material layer (e.g., Si, Ge, SiGe, GeSn, etc.), a Group III-V semiconductor material layer, or a Group II-VI semiconductor material layer, for example. The workpiece may include one or more device layers including a semiconductor material layer, and may also have one or more interconnect levels interconnecting devices (e.g. transistors) of the devices layers. In some examples, a working surface of the workpiece comprises a dielectric material(s) suitable as interlayer dielectric material (ILD). The dielectric material(s) may be directly over semiconductor device structures (e.g., gate, source and drain terminals of a transistor), or over any number of lower-level interconnect structures that are coupled to semiconductor device structures. In exemplary embodiments, a working surface of the workpiece is substantially planar, for example with any of lower level IC structure(s) having been planarized with surrounding dielectric material.

Figure 2A:
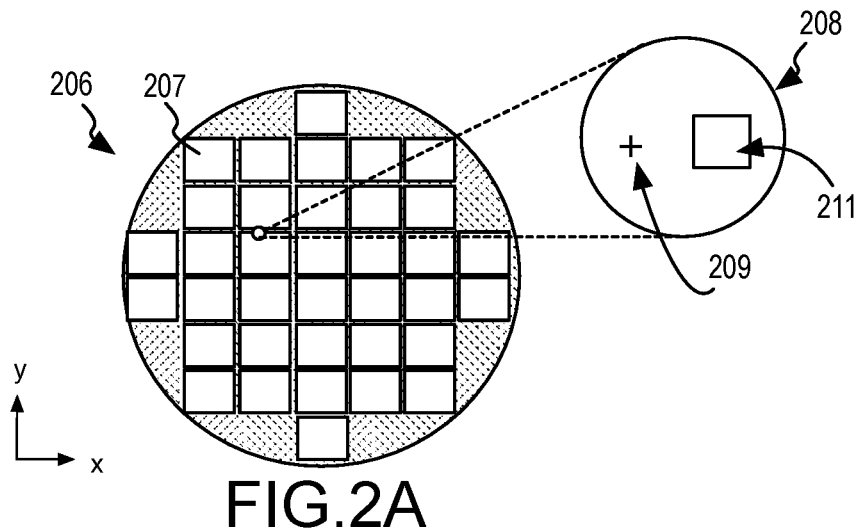
FIGS. 2A, 2B, 2C and 2D are top-down plan views of a wafer evolving during the practice of the methods illustrated in FIG. 1, in accordance with some embodiments.

In the example further illustrated in FIG. 2A, a wafer 206 includes a plurality of ICs arrayed over the working surface of wafer 206. Each IC includes an active circuitry region 207 surrounded by a frame 208, which substantially surrounds circuitry region 207 as a perimeter of an individual IC. As further illustrated in the expanded view of FIG. 2, frame 208 includes an alignment feature 209. Alignment feature 209 was patterned into a material layer within frame 208 during a prior IC fabrication operation. Typically, alignment feature 209 is in a material layer that is also present in circuitry region 207. Alignment mark 209 may have any structure known to be suitable for aligning lithographic levels of an IC as embodiments are not limited in this respect. Frame 208 may further include any number of other structures that have been similarly patterned, such as, but not limited to, a registration feature 211. Registration feature 211 may have any structure known to be suitable for assessing the alignment (e.g., in each of x and y dimensions) between two lithographic levels of an IC, for example as achieved on the basis of alignment feature 209. Examples of registration feature 211 include a box-in-box structure, a vernier scale, etc. Although only two exemplary features are illustrated in FIG. 2A, frame 208 may include any number of "key" areas where features that are to be similarly employed in the further processing of wafer 206 are located.

Returning to FIG. 1, methods 101 continue at block 105 where a material layer is deposited over the workpiece. In exemplary embodiments, the deposited material layer has a chemical composition resulting in poor transmission within the wavelength(s) of an optical alignment process employed in lithographic patterning of the IC structural features. In further embodiments, the material layer is deposited to a thickness that, for the material's particular extinction coefficient, renders the material layer substantially opaque to wavelength(s) employed by the optical alignment process (e.g., UV band).

In some exemplary embodiments, the material layer deposited at block 105 is a conductive interconnect metallization layer. In some embodiments, only one conductive metallization layer is deposited at input. In other embodiments, a stack of material layers is deposited at block 105. For example, a bottom barrier and/or adhesion material layer may be deposited, and then a conductive interconnect material layer is deposited on the bottom barrier and/or adhesion material layer. In some exemplary embodiments, one or more cap materials are deposited over a conductive interconnect material layer. Such cap material(s) may facilitate subtractive patterning of the interconnect metallization and/or may facilitate interconnection of the interconnect metallization with an upper interconnect level. The cap material(s) may also function as a barrier material on a top of interconnect features. In some embodiments, the cap material(s) are a dielectric, and in other embodiments the cap material(s) are metallic compound(s), other electrical conductor(s), or semiconductor(s).

In some specific examples, a metallization layer deposited at block 105 is a transition metal such as, but not limited to one or more of copper (Cu), tungsten (W), titanium (Ti), cobalt (Co), ruthenium (Ru), molybdenum (Mo), aluminum (Al), iridium (Ir), rhodium (Rh) or platinum (Pt). In some examples, a metallization layer is formed at block 105 by electrolytic plating. In other examples, a metallization layer is deposited, at least in part, by chemical vapor deposition (CVD), atomic layer deposition (ALD), or physical vapor deposition (PVD).

Figure 2B:
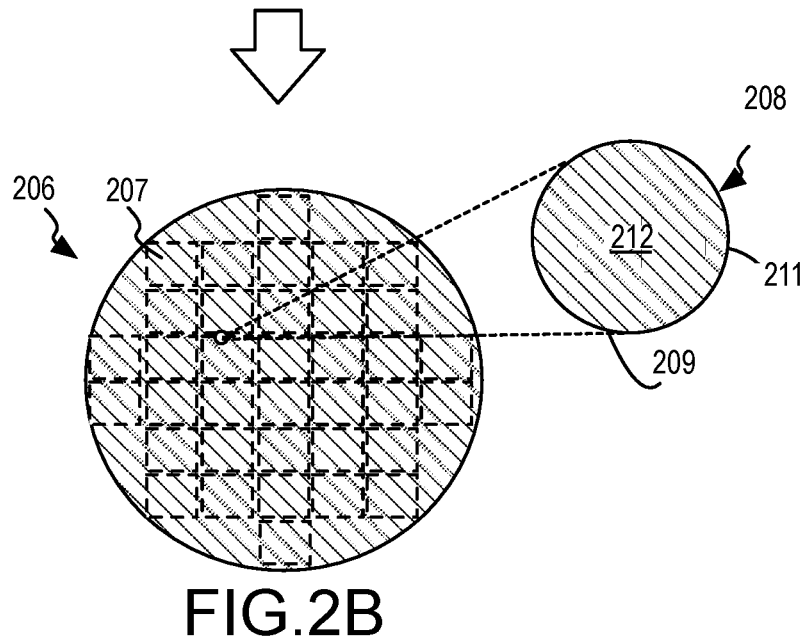

In the example shown in FIG. 2B, interconnect material (e.g., metallization) layer 212 has been deposited over substantially the entire working surface area of wafer 206. For reference, ICs are denoted with dashed lines as being buried below material layer 212. Following the addition of material layer 212, at least alignment feature 209 is no longer visible within frame 208. As shown, registration feature 211 is also no longer visible, and indeed substantially no features within frame 208 or circuitry region 207 may be visible. Hence, following deposition of material layer 212, wafer 206 is unsuitable for nanometer lithographic patterning of a next level of features within the circuitry region 207 because optical opacity of material layer 212 hinders the alignment of wafer 206 to a lithographic reticle.

Returning to FIG. 1, methods 101 continue at block 110 where a photoresist is deposited over the opaque material layer that is to be subtractively patterned. In some embodiments, the photoresist deposited at block 110 is sensitive to at least UV radiation, and more particularly I-line (365 nm wavelength) radiation. In some further embodiments, the photoresist is also sensitive to deep and/or extreme UV radiation (e.g., 193 nm and 13.5 nm). In still other embodiments, the photoresist deposited at block 110 is sensitive to e-beam radiation, and may be sensitive to e-beam radiation as well as deep and/or extreme UV and/or I-line radiation. The photoresist may be a negative or positive formulation as embodiments herein are not limited in this respect.

Methods 101 continue at block 115 where an initial alignment is performed. In some embodiments, the initial alignment is a based on a notch in the wafer. Typically, such "notch alignment" is capable of aligning with a precision of approximately 100 µm. In some other embodiments, the initial alignment performed at block 115 is based on optical imaging of one or more features within a frame of an IC through a backside of the workpiece. In still other embodiments, the initial alignment performed at block 115 is based on an electron beam passed through the workpiece. In further embodiments, the initial alignment performed at block 115 includes both a notch alignment and one or the other of an optical alignment through the backside of the wafer or an e-beam alignment.

At bock 120 a first pattern is directly written into regions of the photoresist located over key areas of a frame around circuitry of an IC. The direct writing is a maskless, or reticle-less process, and is to define key areas of a frame within the photoresist deposited at block 110. In exemplary embodiments, exposure of the photoresist at block 120 is limited to regions of the frame with no portion of IC circuitry exposed. The maskless, direct writing performed at block 120 exposes portions of the photoresist to define regions, or "windows" around key areas of the frame where the photoresist is to be removed (e.g., dissolved). In some embodiments, the windows defined at block 120 are at particular locations, and of sufficient dimensions, to fully encompass alignment features. The windows defined at block 120 may are located where the key frame area is estimated to be based on the initial alignment performed at block 115. The size of the windows defined at block 120 may therefore be a function of the precision of the initial alignment performed at block 115. In some embodiments, the lateral dimensions of the windows defined at block 120 are at least 100× the critical dimensions of a feature located within the key area being exposed by the window. For example, where the window is to fully encompass an alignment feature having resolution under 100 nm, the window has an area of at least 1 $\mu m^2$, and may have an area of at least 10 $\mu m^2$, or at least 100 $\mu m^2$.

In exemplary embodiments, the pattern directly written at block 120 employs a beam of radiation that is raster scanned over the wafer area of photoresist. The intensity of the radiation is modulated with time and/or location of the raster within the working surface area so as to vary the exposure dose, which modulates the solubility of the photoresist, for example, between exposed an unexposed regions. The direct writing at block 120 may be with optical (photon) radiation, electron radiation, or x-ray radiation. In an example where an I-line photoresist is deposited at block 110, I-line radiation is scanned over the wafer surface at block 120. In other embodiments, for example where a G-line, DUV, or EUV photoresist is deposited at block 110, 248 nm, 193 nm, or 13.5 nm radiation is scanned over the wafer surface at block 120. In other examples, where e-beam photoresist is deposited at block 110, an electron beam is scanned over the wafer surface at block 120. Following the direct writing process, the photoresist is developed with any liquid, vapor, or dry develop process known to be suitable for a particular photoresist formulation. Following the develop process, key regions of frame are no longer protected by the photoresist.

Methods 101 continue at block 130 where regions of the opaque material layer not protected by the patterned photoresist are etched, translating the photoresist pattern into the opaque material (e.g., metallization) layer deposited at block 105. Any etch process known to be suitable for the material deposited at block 105 may be practiced at block 130 to remove any thickness of the material required to render underlying features visible to an optical lithography alignment system. In exemplary embodiments, substantially the entire thickness of the material deposited at block 105 is etched through at block 130 to expose any underlying material layer. Any etch process may be enlisted at block 130. For example, patterning may be accomplished with a wet chemical etch or reactive ion etching (RIE). Upon completion of block 130, an underlying alignment feature should be visible to the optical alignment system that will be subsequently employed for fine alignment of the workpiece during photolithographic patterning of circuitry features.

Figure 2C:
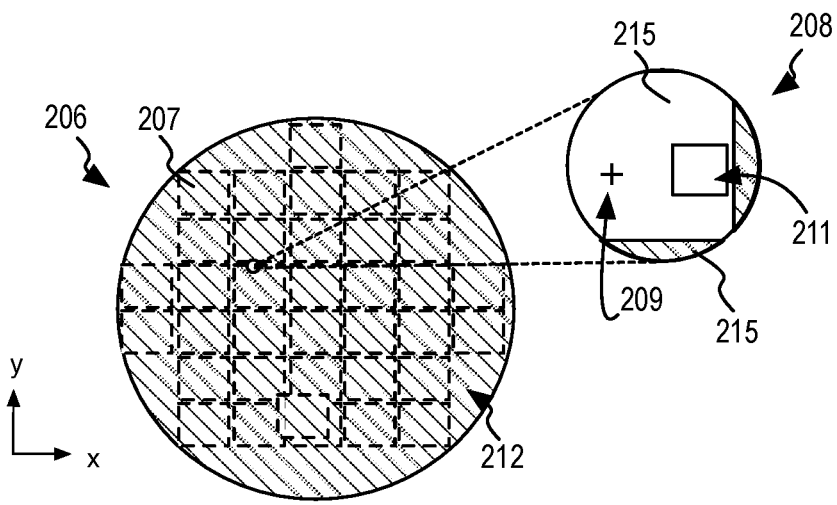
Figure 2D:
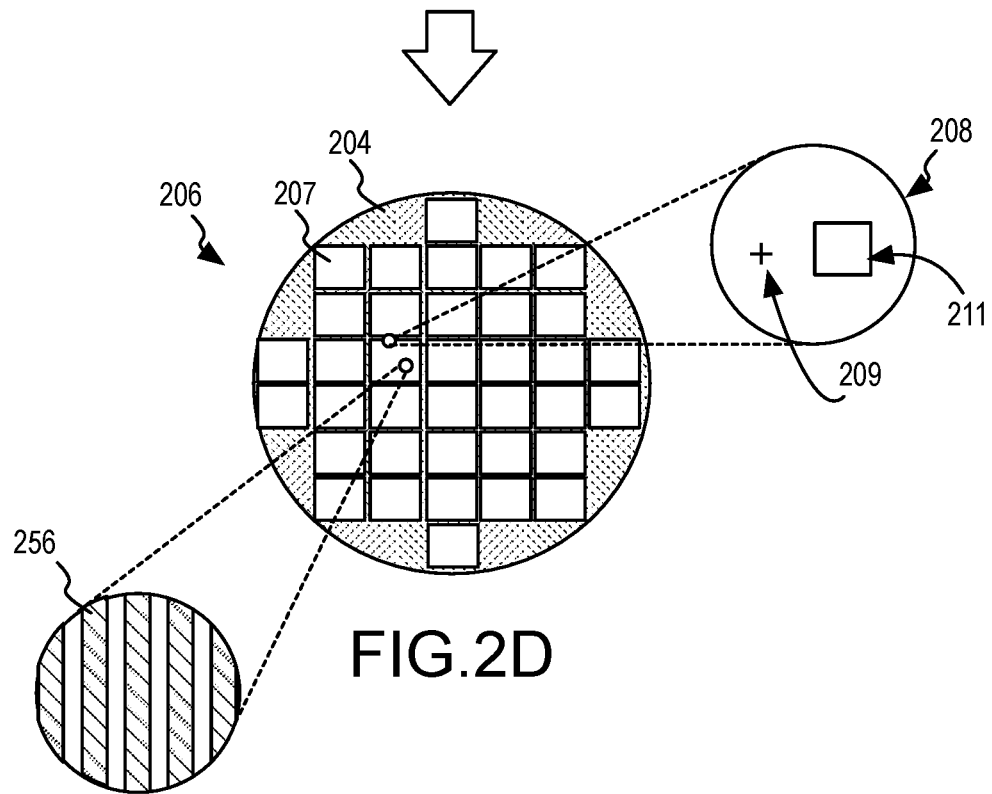

FIG. 2C further illustrates an example where a reveal window 215 has been etched into frame 208. As further illustrated, material layer 212 remains over circuitry region 207. In the expanded view of FIG. 2C, a boarder of window 215 can be seen to completely encompass, surround, or enclose alignment feature 209. Reveal window 215 completely encompasses, surrounds, or encloses registration feature 211. Although a single window 215 is shown to encompass both alignment feature 209 and registration feature 211, a first window 215 may surround alignment feature 209 while a second window 215 may surround registration feature 211. Any number of reveal widows 215 may be opened with material layer 212 to expose any number of features within any number of key areas of a frame.

Returning to FIG. 1, methods 101 continue with a second subtractive patterning of the opaque material layer. This second patterning is with a lithography system capable of defining features with nanometer resolution. In some embodiments, the same photoresist deposited at block 110 is patterned with the nanometer resolution photolithography process. In alternative embodiments, the photoresist deposited at block 110 is stripped off following completion of block 130, and another photoresist that is more suitable for the nanometer lithography process is then deposited over the workpiece. Methods 101 continue at block 140 where secondary alignment of the workpiece is performed. The secondary alignment at block 140 is based, at least in part, on optical fine alignment to a feature located within a window that was opened into the opaque material at block 130. In absence of the opaque material layer, the alignment feature(s) within the window(s) are visible to the nanometer lithography system.

At block 145, another feature pattern is defined in the photoresist, this time with a reticle mask, which determines where a photon-based (optical) exposure of the photoresist occurs. The patterning at block 145 defines mask features located within the circuitry area of an IC, and may also define additional mask features within the frame around the circuitry area. In some examples, the patterning performed at block 140 is one of 193 nm (DUV), immersion DUV lithography, or 13.5 nm (EUV) lithography. Since the recticle mask is aligned to the underlying feature (e.g., alignment mark), features defined in the photoresist will have some (mis)registration to the lower levels of the IC die that is substantially the same as the (mis)registration associated with the optical fine alignment to the alignment feature.

Methods 101 continue at block 155 where the portion of the opaque material layer deposited at block 105 within the circuitry region of an IC is subtractively patterned. In some exemplary embodiments where the opaque material layer is a conductive interconnect metallization layer, interconnect metallization features of one interconnect level are etched at block 155. Those features may be, for example, vias that provide a vertical conductive pathway through an interconnect level and/or between levels. Those features may also be, for example, lines that provide a lateral or horizontal conductive pathway within an interconnect level. The interconnect metallization features are therefore patterned based on the optical fine alignment to the alignment feature(s), and therefore any misregistration of the interconnect metallization features to underlying features within the the IC die will be substantially the same as any misregistration of the interconnect metallization features to the alignment feature. If instead, the interconnect metallization features were patterned based on an alignment to some feature other than that revealed during the maskless patterning, the degree of misregistration between the patterned interconnect metallization features and the feature(s) revealed by the maskless patterning would not match the misregistration between the patterned interconnect and other features of the IC that are in the same underlying level of the IC.

Any etch process capable of nanometer resolution may be enlisted at block 155. For example, patterning of the an interconnect material layer may be accomplished through reactive ion etching RIE, using a capacitively coupled plasma source (CCP), an inductively coupled plasma source (ICP), or an electron cyclotron resonance (ECR) plasma source. This etch process may be the same as that employed at block 130, but need not be. For RIE embodiments, any chemistry known to be suitable for the composition of the opaque material layer may be energized by the plasma source. In exemplary embodiments where a conductive interconnect material is etched, one or more of $O_2$, $Cl_2$, $Br_2$, $CF_4$, $C_2F_6$, $C_4F_8$, $H_2$, $CH_4$, $CH_3CH_3$, $CH_3OH$, $CH_3CH_2OH$, Ar, He, or Xe are employed to etch through (i.e. remove) portions the interconnect material layer not protected by the photoresist pattern. For materials that are difficult to subtractively pattern, such as Cu, a highly physical milling process may a be practiced, for example with an ion beam etching (IBE) source where Ar or He ions are accelerated into the workpiece surface with high kinetic energies in order to sputter away exposed metal. For highly physical etch process, one or more hardmask material layers may be first etched according to the photoresist mask and the underlying material then etched with the benefit of the overlying hardmask.

Notably, although only one exposure and one etch block is illustrated in methods 101, any multiple patterning process may be practiced at block 145 and 155 to fully pattern the material layer(s) that were deposited at block 105. If a multiple patterning process is performed, at least one of them is optically aligned to features uncovered by the etch performed at block 130. In the example illustrated in FIG. 2D, material layer 212 is fully patterned within both circuitry region 207 and any regions of frame 208 that were not previously patterned as key areas. As shown in the enlarged view of circuitry region 207, structural features (e.g., lines) 256 of a conductive interconnect material have been etched from material layer 212. With the opaque material layer fully patterned, methods 101 (FIG. 1) complete at output 160 where any processes may be practiced to complete IC fabrication accordingly to any known techniques.

Figure 3:
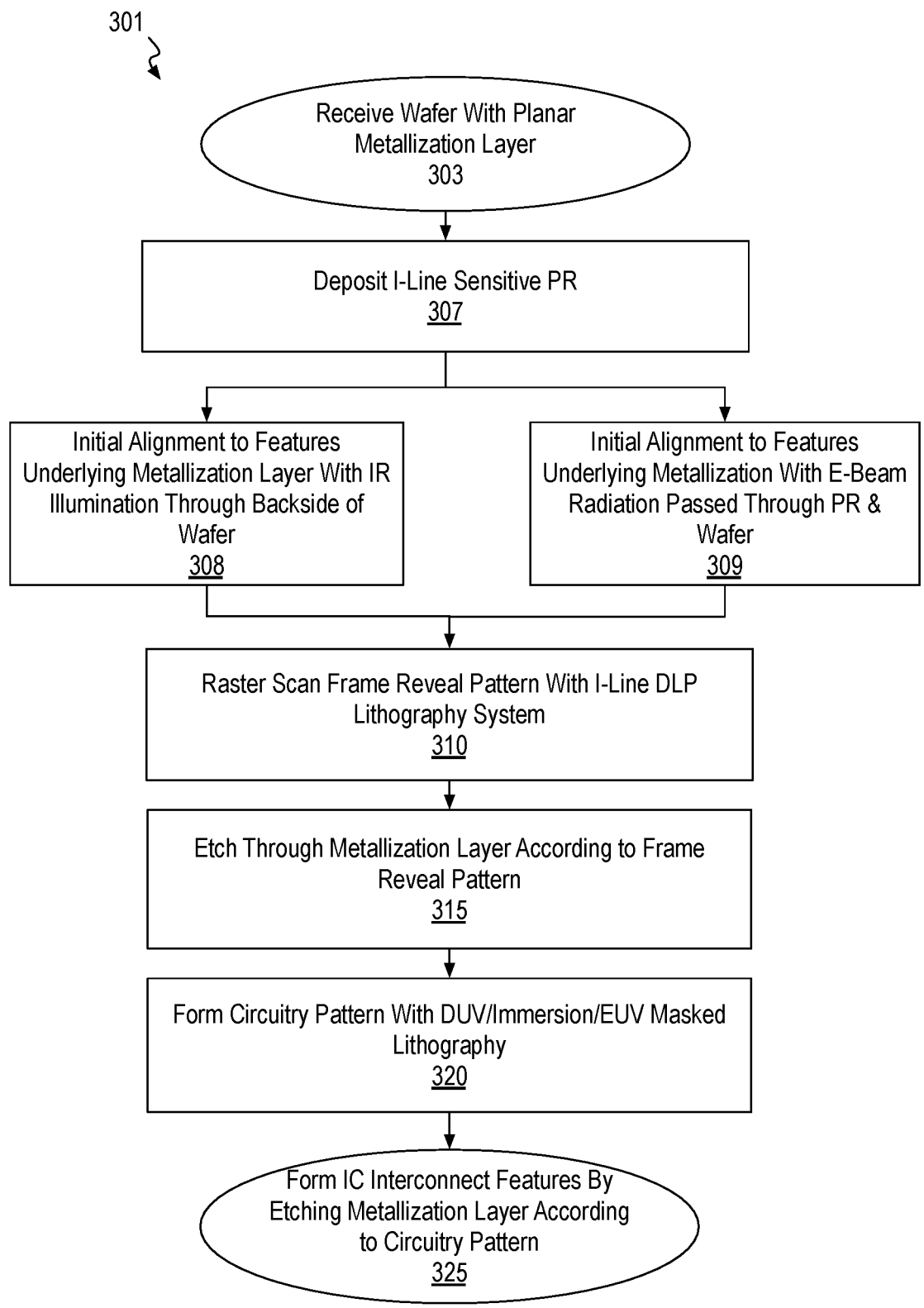
FIG. 3 is a flow diagram illustrating methods of subtractively patterning an IC interconnect material layer with a reveal of key areas of a frame defined by digital light processing (DLP) lithography, in accordance with some embodiments.

FIG. 3 is a flow diagram illustrating methods 301 for subtractively patterning an IC interconnect material layer with a reveal of key areas of a frame by digital light processing (DLP) lithography, in accordance with some embodiments. Methods 301 may be practiced as an embodiment of methods 101, for example. FIG. 4A-8A are plan views of an IC region and a frame region of a wafer evolving as blocks in the methods 301 are practiced, in accordance with some embodiments. FIG. 4B-8B are cross-sectional views of an IC region of a wafer (along the B-B' line illustrated in FIG. 4A-8A) as blocks in the methods 301 are practiced in accordance with some embodiments. FIG. 4C-8C are cross-sectional views of a frame region of a wafer (along the C-C' line illustrated in FIG. 4A-8A) as blocks in the methods introduced in FIG. 3 are practiced in accordance with some embodiments. Methods 301 may be practiced to arrive at the structures illustrated in FIGS. 4A-8A, 4B-8B and 4C-8C, but may also be practiced to form other structures. Similarly, methods other than methods 301 may be practiced to arrive at the structures illustrated in FIGS. 4A-8A, 4B-8B and 4C-8C.

Referring first to FIG. 3, the DLP-based methods 301 begin at input 303 where a wafer with a planar metallization layer is received at block 303. The metallization layer may be any composition. In some examples, the metallization layer includes one or more of Cu, W, Ti, Co, Ru, Mo, Ir, Rh or Pt. Any number of IC layers (e.g., device layers, interconnect layers, etc.) may be below the metallization layer.

Methods 301 continue at block 307 where an I-line sensitive photoresist is deposited over the metallization layer. The I-line photoresist may have any known composition as embodiments are not limited in this respect. The I-line photoresist may also be deposited by any means and to any thickness suitable for the application.

Methods 301 continue with either an initial optical alignment performed at block 308 or an initial e-beam alignment performed at block 309. At block 308 an IC (frame) feature is illuminated through the backside of the wafer with radiation the IR band. At block 309 an IC (frame) feature is exposed to an e-beam and the IC frame feature is identified with backscatter electron analysis.

FIG. 4A illustrates a first top-down plan view of IC circuitry region 207 and a second top-down plan view of frame region 208. An I-line photoresist 450 is over both regions 207 and 208. Interconnect features 412 (e.g., vias) are shown in dashed line within circuitry region 207 to emphasize features 412 are not visible from top down. Within frame 208, alignment feature 209 is of the same material and same interconnect level as interconnect features 412 (and therefore also not visible from top down).

FIG. 4B is cross-sectional view of circuitry region 207 along the B-B' line depicted in FIG. 4A. As shown, interconnect feature 412 is immediately below, and in direct contact with, opaque material layer 212. In this example, material layer 212 is an interconnect metallization comprising one or more metal layers (e.g., Cu, W, Ti, Co, Ru, Mo, Ir, Rh or Pt) that are to be subtractively patterned into interconnect features (e.g., lines). As further shown, interconnect feature 412 is co-planar with an adjacent dielectric material 410. Dielectric material 410 may be a low-k dielectric material, for example having a relative permittivity less than about 3.5. Dielectric material 410 may also be a conventional dielectric material with a somewhat higher relative permittivity in the range of 3.5-9. In some specific examples, dielectric material 410 is any of SiOC, hydrogen silsesquioxane, methyl silsesquioxane, polyimide, polynorbornene, benzocyclobutene SiN, SiO, SiON, $HfO_2$, ZrO, or $Al_2O_3$, for example. Circuitry region 207 further includes a device layer 405 that includes one or more devices 406. In exemplary embodiments, devices 406 are metal-oxide-semiconductor field effect transistor (MOSFET) structures. However, devices 406 may also be other transistor types, such as, but not limited to other FET architectures, or bipolar junction transistors. Devices 406 may also be other devices that include one or more semiconductor junctions (e.g., diodes, etc.). Device layer 405 is over one or more substrate layers 401, which may include a bulk crystalline semiconductor (e.g., predominantly silicon), or any other suitable material.

FIG. 4C is cross-sectional view of frame 208 along the C-C' line depicted in FIG. 4A. Unlike circuitry region 207, which remains substantially free from radiation during the initial alignment process, frame 208 is irradiated with either IR ($\lambda_{IR}v$) 408 or an e-beam 409. As depicted, IR 408 passes through substrate layers 401 since many semiconductor substrates, such as silicon, have high transmission within the IR band. IR 408 may therefore illuminate alignment feature 209 without having to pass through material layer 212. Such IR-based alignment is suitable for sub-5 μm (e.g., 1-5 μm) precision.

As further illustrated in FIG. 4C, if instead e-beam 409 is passed through photoresist 450, material layer 212, and into underlayers including alignment feature 209, backscattered electrons (BSE) may then be analyzed to identify edges of alignment feature 209. E-beam 409 can be expected to expose photoresist 450, hence significant areas of frame 208 may become exposed during the alignment process with a precision of the placement of these exposed area being limited, for example, to a notch alignment performed as part of the e-beam alignment process. Hence, for e-beam embodiments the act of initial alignment may completely expose frame regions of photoresist 450 around alignment feature 209, or may expose frame regions of photoresist 450 that do not include alignment feature 209 such that initial alignment may fail to identify alignment feature 209 and must be repeated, exposing additional regions of photoresist 450.

Returning to FIG. 3 with the initial alignment complete, method 301 continues at block 310 where a direct writing process is performed by a raster scan with a DLP lithography system. The DLP writing process performed at block 310 is based on the initial alignment, and in exemplary embodiments the DLP lithography system includes the IR alignment employed to practice block 308. For embodiments where initial alignment was with e-beam radiation, block 310 may be unnecessary if the e-beam alignment process fully exposed regions of the photoresist fully encompassing the alignment features.

Although various wavelengths of light may be employed at block 310, the wavelength(s) is advantageously within the UV band, and in exemplary embodiments an I-line DLP lithography is practiced at block 310 to expose key areas in a frame to open windows over underlying alignment features, but not expose areas of circuitry. I-line DLP is capable of scan lines with a pixel dimension of as little as 1 μm (i.e., pixel size or area of 1 $\mu m^2$). Hence, multiple scan lines may be stitched together in a raster path to define reveal windows of 1-100 μm in each of an x and y dimension over a wafer area positioned with the precision of the initial alignment (e.g., <5 micron).

FIG. 5A illustrates a top-down plan view of circuitry region 207 and a top-down plan view of frame 208, during performance of an I-line DLP raster exposure. As shown, during a scan the intensity of the I-line radiation is reduced below an exposure threshold within circuitry region 207 so that no portion of photoresist 450 over circuitry region 207 is exposed. As further shown, when a scan is over frame 208 the intensity of the I-line radiation is increased to at least the exposure threshold so that photoresist 450 is altered into exposed photoresist 560. DLP raster scan lines 562 are illustrated in dashed line with a plurality of such lines defining a pixelated polygon of exposed photoresist 560. As shown, a stitch error 564 of one or more pixels can occur between successive scan lines 562. The stitch error 564 in some examples has a lateral (e.g., in x dimension) jog size of 1-2 μm. Depending on the shape of the polygon, exposed photoresist 560 may be more or less pixelated. For example, in a substantially rectilinear polygon that is aligned substantially parallel with the scan line, exposed photoresist 560 may have little pixelation except for that induced by stitching errors that are manifested at the polygon edges perpendicular to the scan line (e.g., along y-dimension). For polygons that include edges 566 non-parallel and non-orthogonal to the scan line, those edges 566 are estimated with pixels of 1 $\mu m^2$, or more. Whereas a positive or negative stitching error may occur between each scan line, pixelated edges 566 are non-random adjustments to the UV intensity of the projected UV radiation. Such pixelation and stitching errors are indicative of direct exposure of the photoresist, and would not be present if reticle-based lithography was instead employed to define windows of exposed photoresist 560. The pixel size is a function of both the I-line wavelength and the projection system, and therefore is indicative both of the direct writing technique and of the DLP lithography system employed in the direct writing.

FIG. 5B, a cross-sectional view along the B-B' line in FIG. 5A, further illustrates photoresist 450 to be substantially free from exposed regions throughout the DLP lithography frame area reveal process. FIG. 5C, a cross-sectional view along the C-C' line in FIG. 5A, further illustrates photoresist 450 to be at least partially exposed during the DLP lithography frame area reveal process. FIGS. 6A, 6B and 6C illustrate the circuitry region 207 and frame 208 following the DLP lithography process and any develop process suitable for dissolving exposed photoresist. Although a positive photoresist embodiment is illustrated in FIG. 6A-6C, an inverse, or complementary, exposure and develop process may also be practiced for negative photoresist embodiments as embodiments herein are not limited in this respect. As shown in FIG. 6A, pixelated edge 566 and pixelated stitching errors 564 are evident in the patterned photoresist 450 as the pixels are larger than the resolution limit of photoresist 450. As further shown in FIG. 6A, photoresist edge 451 fully encloses alignment feature 209.

Returning to FIG. 3 with the frame reveal mask pattern defined, methods 301 continue at block 315 where the metallization layer is etched according to the reveal mask pattern to reveal the underlying key areas of the frame. In exemplary embodiments, patterning of the metallization layer may be accomplished through RIE, for example using any of the plasma sources and/or chemistries described above. FIGS. 7A, 7B, and 7C illustrate the circuitry region 207 and frame 208 following the etch process. Photoresist 450 is illustrated in dashed line in FIGS. 7B and 7C as it may either be removed, or retained after the frame reveal etch. As shown in FIG. 7A, pixelation that was present in the photoresist pattern is translated into reveal window 712 etched into material layer 212. The pixelation associated with the DLP lithography may therefore be a permanent feature of alignment reveal windows opened in frame 208. As shown in FIGS. 7B and 7C, while a full thickness Tl of material layer 212 is retained within circuitry region 207, the thickness TI of material layer 212 is fully removed from within the reveal window 712. In the illustrated example, reveal window 712 exposes dielectric material 410 and alignment feature 209 (or a stop layer thereon). Some non-zero amount of over etch of depth D1 can be expected from the reveal etch process. The overetch depth D1 may vary with implementation, but in some examples is 5-20 nm.

Returning to FIG. 3 with the alignment reveal complete, methods 301 continue at block 320 where a circuitry pattern is defined into a mask with any reticle-based lithography process capable of nanometer feature resolution. In exemplary embodiments, at least one of DUV, immersion UV, or EUV lithography is practiced at block 320 with any suitable transmissive or reflective optics-based system and reticle to form interconnect features within circuitry regions of an IC. Following the frame reveal etch, the alignment process associated with the lithography performed at block 320 proceeds unimpeded. Methods 301 may then complete at output 325 where IC interconnect features are etched into the metallization layer. As shown in FIG. 8A, interconnect lines have been defined into photoresist 450. In this example, therefore, photoresist 450 is both I-line sensitive and UV sensitive so that photoresist 450 may be exposed twice (a first time to define reveal windows in the frame with the DLP system, and a second time with a DUV/EUV reticle based system). As further illustrated in FIG. 8B, circuitry recesses 812 remove substantially the entire thickness TI of material layer 212 to define individual interconnect lines 256, some of which are in direct contact with an underlying interconnect feature 412. Etch recesses 812 again leave some overetch recess of a non-zero depth D2 in dielectric material 410 (or a stop layer thereon). Depth D2 may be different (deeper or shallower) than depth D1 introduced above (FIG. 7C), which may be indicative of the reveal window 712 and circuitry recesses 812 having been etched separately (i.e., not concurrently). For embodiments where photoresist 450 is exposed twice, reveal window 712 will reach an overetch depth D3, which is both larger than depth D2 and depth D1.

Alternatively, for embodiments where photoresist 450 is removed after the alignment reveal etch, a second photoresist sensitive to UV radiation is applied at block 320 (FIG. 3). For such embodiments, the second photoresist may fill in reveal window 712. Reveal window 712, or some portion thereof that contains alignment feature 209, may be again exposed out at block 320, or not. If photoresist applied over reveal window 712 is not developed out, reveal window 712 will remain substantially equal to depth D1 (FIG. 7C). If it is developed out, some portions of reveal window 712 may remain with depth D1 while other portions have a larger over etch depth D3.

Figure 9A:
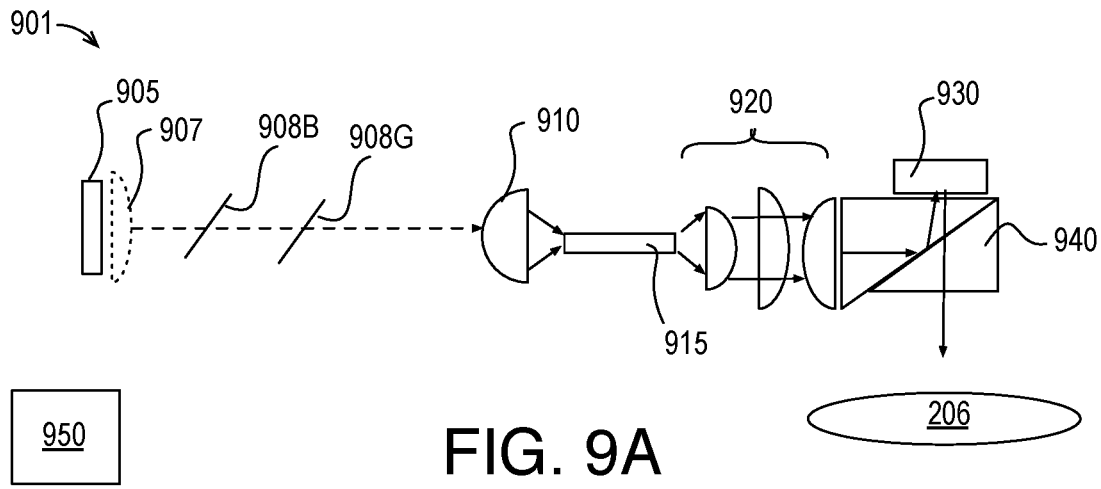
FIGS. 9A, 9B and 9C are schematics of a DLP lithography system, in accordance with some embodiments.
Figure 9B:
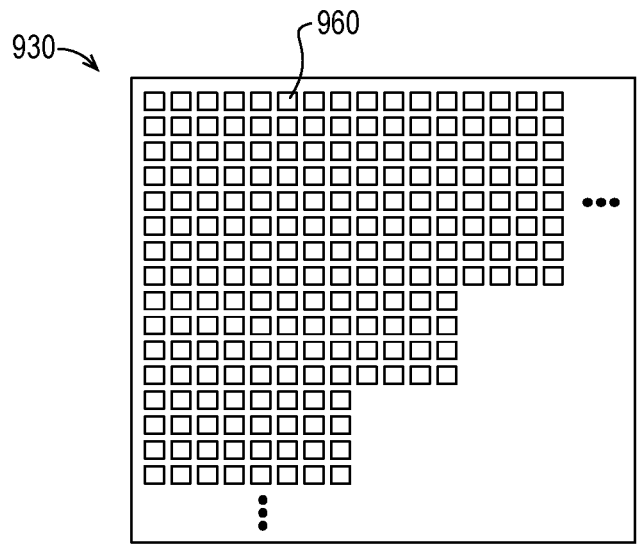
Figure 9C:
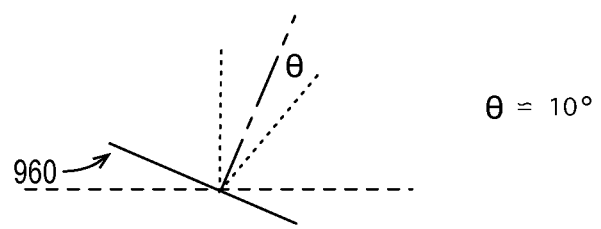
Figure 10:
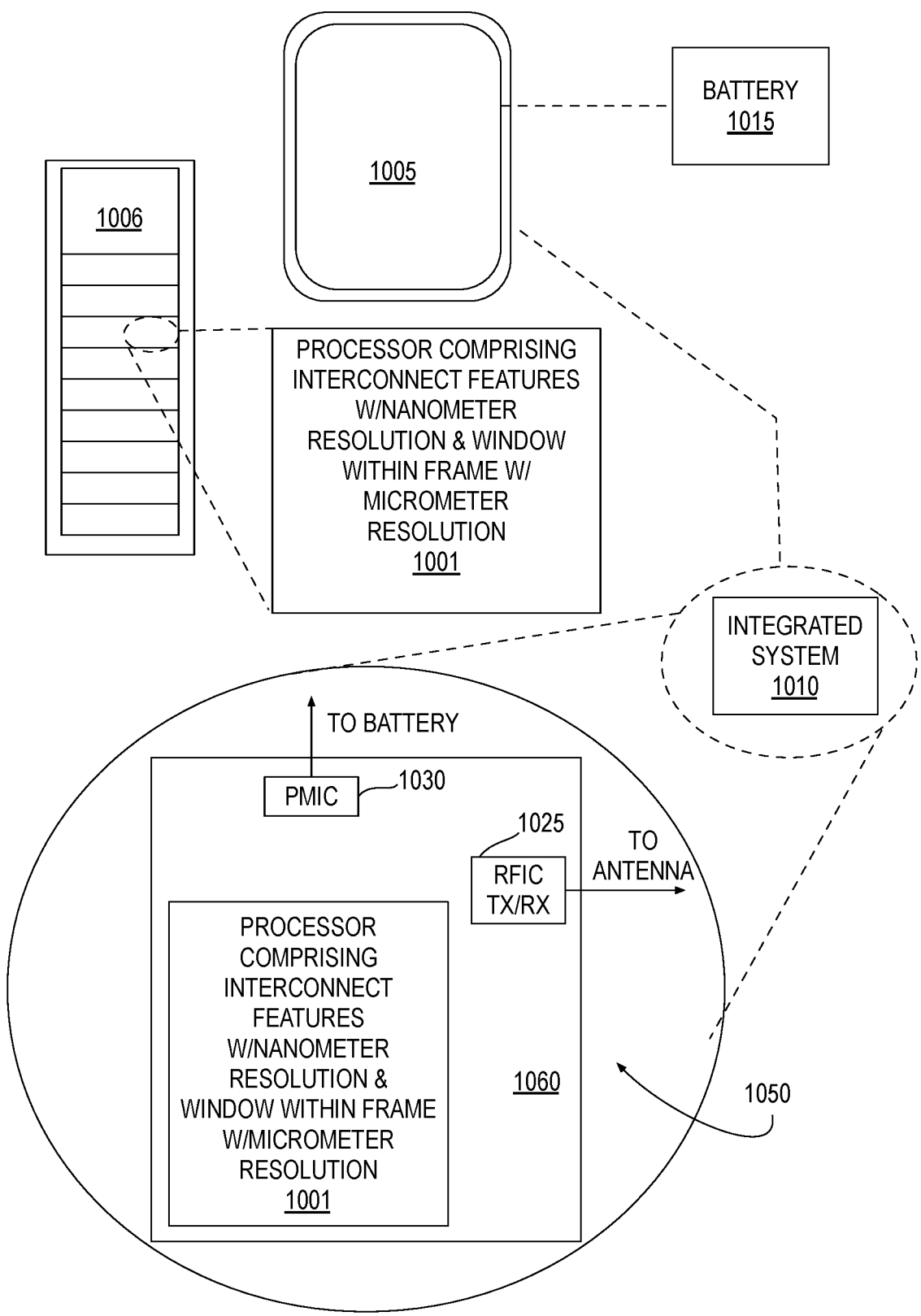
FIG. 10 illustrates a mobile computing platform and a data server machine employing an IC that includes interconnect structures with nanometer resolution co-planar with frame area openings that have micrometer resolution, in accordance with embodiments.

FIGS. 9A, 9B and 9C are schematics of a DLP lithography system 901, in accordance with some embodiments. DLP lithography system 901 may be employed in the practice of methods 301, and more specifically block 310, for example. In some embodiments, system 901 includes one or more UV source 905 ($\lambda \approx 13.5$-193 nm). Coupling optics may comprise one or more discrete collimating lenses 907. Coupling optics may further comprise one or more dichroic filters 908B and 908G (e.g., for beam steering and/or conditioning), a condenser lens (stack) 910, and an optical integrator 915 to improve spatial distribution uniformity. Optical integrator 915 may be any glass rod or hollow tube mirror wall integrator known in the art to be suitable for spatially randomizing the input light, for example. Alternatively, DLP system 901 may include any lens-array type integrator known to be suitable for the application. The optical path is completed with reflective and/or refractive relay optics 920 and a total internal reflection (TIR) prism 940. Prism 940 is optically coupled to a digital mirror device (DMD) 930. DMD 930 may receive image data, from one or more computer processors 950 and, in response to the image data, may reflect pixels of projected light through prism 940 to project a beam of light having a certain intensity. The beam may be projected and/or raster scanned over wafer 206 through any means, such as, but not limited to a mirror and/or lens galvanometer (not depicted).

FIG. 4B is an expanded plan view of DMD 930, in accordance with some embodiments. DMD 930 includes an array of mirrors 960 with each mirror corresponding to a portion of a projector beam. Each mirror 960 is configured to tilt about an axis in response to an electrical signal applied thereto, for example derived from virtual image data provided by processor 950. With a sufficient number of mirrors directing a beam to a same target, the beam has a threshold intensity over an area of the target. With an insufficient number of mirrors directing a beam to the target, the beam has less than a threshold intensity over the area of the target.

FIG. 4C is a graph illustrating micro mirror rotation, in accordance with some embodiments of DMD 930. In this example, mirror 960 may tilt approximately +/−10° with respect a plane that is perpendicular to the plane of mirror 960 through the tilt axis. One mirror orientation (e.g., +10°)

may correspond to an "ON" state and the other mirror orientation (e.g., −10°) corresponds to an "OFF" state. Intensity of the beam exiting prism 940 at any given time may therefore be a function of the number of mirrors in each orientation. As the beam is raster scanned over wafer 206, intensity of the beam may therefore be varied.

The maskless frame reveal structures, and the methods of forming such structures described herein may be integrated into a wide variety of ICs and computing systems that include such ICs. FIG. 8 illustrates a system in which a mobile computing platform 1005 and/or a data server machine 1006 employs an IC including interconnect features with nanometer resolution and a window within a frame surrounding the interconnect features having micrometer resolution, for example in accordance with some embodiments described elsewhere herein. The server machine 1006 may be any commercial server, for example including any number of high-performance computing platforms within a rack and networked together for electronic data processing, which in the exemplary embodiment includes a monolithic IC 1050. The mobile computing platform 1005 may be any portable device configured for each of electronic data display, electronic data processing, wireless electronic data transmission, or the like. For example, the mobile computing platform 1005 may be any of a tablet, a smart phone, laptop computer, etc., and may include a display screen (e.g., a capacitive, inductive, resistive, or optical touchscreen), a chip-level integrated system 1010, and a battery 1015.

Whether disposed within the integrated system 1010 illustrated in the expanded view 1001, or as a stand-alone packaged chip within the server machine 1006, IC 1050 may include memory circuitry (e.g., RAM), and/or a logic circuitry (e.g., a microprocessor, a multi-core microprocessor, graphics processor, or the like). At least one of these circuitries further includes interconnect features having nanometer resolution and a window within a frame surrounding the circuitry having micrometer resolution, for example in accordance with some embodiments described elsewhere herein. IC 1050 may be further coupled to a board or package substrate 1060 that further hosts one or more additional ICs, such as power management IC 1030 and radio frequency IC 1025. RFIC 1025 may have an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 11:
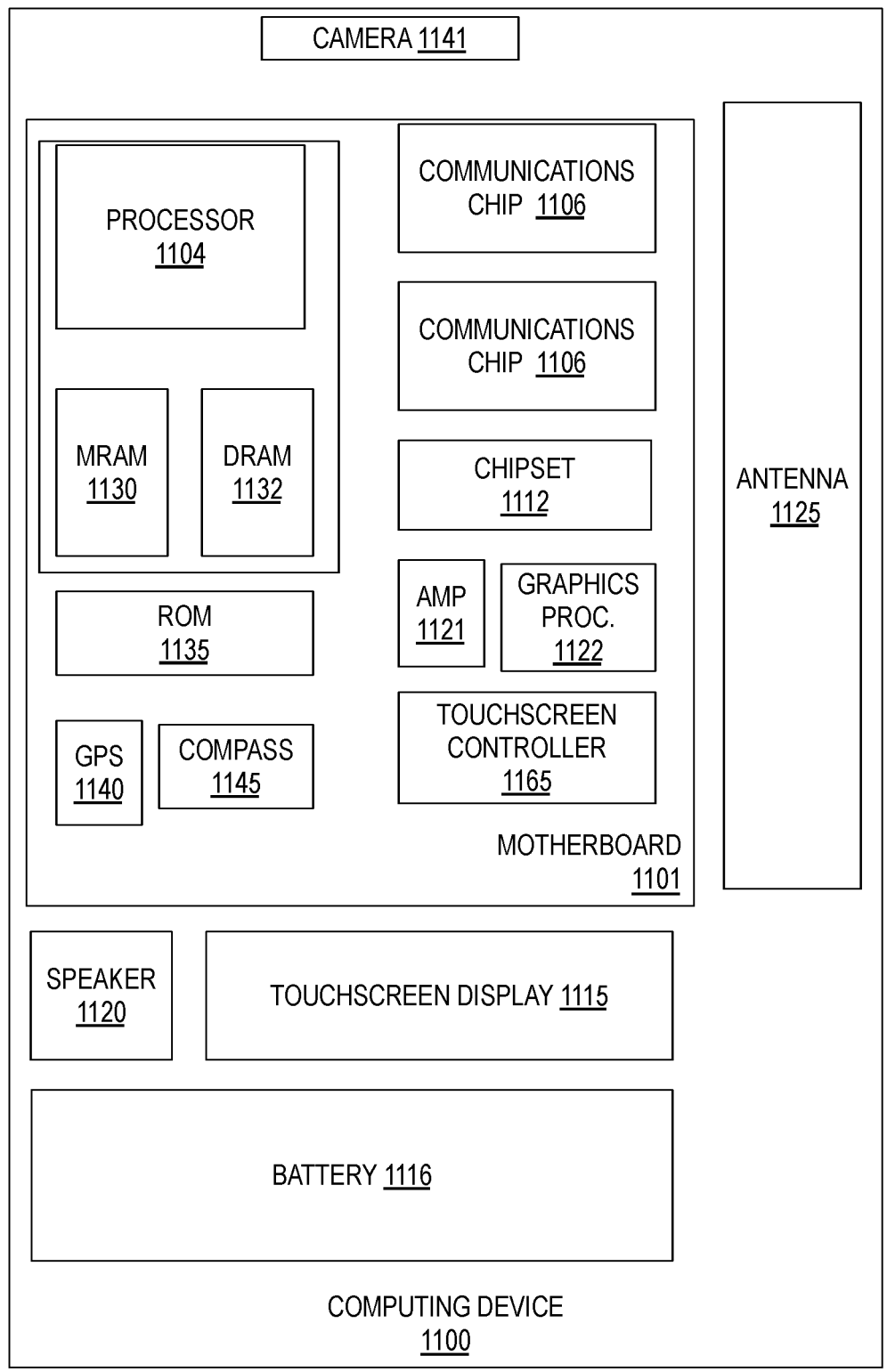
FIG. 11 is a functional block diagram of an electronic computing device, in accordance with some embodiments.

FIG. 11 is a functional block diagram of an electronic computing device 1100, in accordance with some embodiments. Device 1100 further includes a motherboard 1101 hosting a number of components, such as, but not limited to, a processor 1104 (e.g., an applications processor). Processor 1104 may be physically and/or electrically coupled to motherboard 1101. In some examples, processor 1104 is part of a monolithic IC structure interconnect features having nanometer resolution and a window within a frame surrounding the circuitry having micrometer resolution, for example in accordance with some embodiments described elsewhere herein, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1106 may also be physically and/or electrically coupled to the motherboard 1101. In further implementations, communication chips 1106 may be part of processor 1104. Depending on its applications, computing device 1100 may include other components that may or may not be physically and electrically coupled to motherboard 1102. These other components include, but are not limited to, volatile memory (e.g., DRAM 1132), non-volatile memory (e.g., ROM 1135), flash memory (e.g., NAND or NOR), magnetic memory (MRAM 1130), a graphics processor 1122, a digital signal processor, a crypto processor, a chipset 1112, an antenna 1125, touchscreen display 1115, touchscreen controller 1165, battery 1116, audio codec, video codec, power amplifier 1121, global positioning system (GPS) device 1140, compass 1145, accelerometer, gyroscope, speaker 1120, camera 1141, and mass storage device (such as hard disk drive, solid-state drive (SSD), compact disk (CD), digital versatile disk (DVD), and so forth, or the like.

Communication chips 1106 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1106 may implement any of a number of wireless standards or protocols, including, but not limited to, those described elsewhere herein. As discussed, computing device 1100 may include a plurality of communication chips 1106. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example, the above embodiments may include specific combinations of features as further provided below.

In first examples, an integrated circuit (IC) die comprises a level of interconnect features with nanometer dimensions and comprising metallization, and a lithography alignment feature within a level of the IC die below the level of interconnect features. The IC die comprise a reveal window within which the metallization is absent. A perimeter of the reveal window has micrometer pixelation. The reveal window is coplanar with the level of interconnect features. The perimeter of the reveal window surrounds the alignment feature.

In second examples, for any of the first examples the perimeter of the reveal window comprises a plurality of pixels having a lateral dimension of at least 1 μm.

In third examples, for any of the first through second examples the perimeter of the reveal window comprises one or more stitching errors of at least one pixel in magnitude, and one pixel has area of at least 1 µm².

In fourth examples, for any of the first through third examples the reveal window has a lateral dimension of at least 100 µm. The interconnect features are interconnect lines comprising a metal, and the lithography alignment feature has nanometer dimensions.

In fifth examples, for any of the fourth examples the metal is Cu, W, Ti, Co, Ru, Mo, Ir, Rh or Pt.

In sixth examples, for any of the first through fifth examples the IC die further comprises a registration feature coplanar with the alignment feature, and wherein the reveal window also surrounds the registration feature.

In seventh examples, a computer system comprises a power supply and the IC die of any of the first through sixth examples.

In eighth examples, a method of fabricating an integrated circuit (IC) comprises receiving a substrate with a planar surface and comprising an alignment feature, depositing a layer of metallization over the planar surface, and performing a first alignment. The method comprises removing a portion of photoresist from over the layer of metallization by directly writing a first pattern with a maskless photolithography process based on the first alignment, and revealing the alignment feature by etching the metallization according to the first pattern. The method comprises performing, based on the alignment feature, a second alignment and defining, with a masked photolithography process, a second pattern in a photoresist over the layer of metallization based on the second alignment. The method comprises forming metallization features by etching the second pattern into the layer of metallization.

In ninth examples, for any of the eighth examples the maskless photolithography process comprises digital light processing (DLP) projection lithography.

In tenth examples for any of the ninth examples the DLP lithography comprises raster scanning I-line radiation over the photoresist.

In eleventh examples, for any of the eighth through tenth examples the first alignment comprises illuminating a feature through the substrate with infrared (IR) radiation.

In twelfth examples, for any of the eleventh examples the feature is the alignment feature.

In thirteenth examples, for any of the ninth through twelfth examples the masked photolithography process employs deep ultraviolet (DUV) or extreme UV (EUV) radiation.

In fourteenth examples, for any of the eighth examples the maskless photolithography process comprises e-beam lithography.

In fifteenth examples, for any of the eighth through fourteenth examples depositing the layer of metallization further comprises depositing Cu, W, Ti, Co, Ru, Mo, Ir, Rh or Pt, and forming the metallization features further comprises forming lines or vias from the layer of metallization.

In sixteenth examples, for any of the eighth through fifteenth examples the method comprises depositing an I-line sensitive photoresist over the layer of metallization, directly writing the first pattern with the maskless photolithography process into the I-line photoresist, removing the I-line sensitive photoresist, depositing a second photoresist over the layer of metallization, and defining the second pattern in the second photoresist.

In seventeenth examples, for any of the eighth through sixteenth examples etching the layer of metallization according to the first pattern reveals the registration mark.

In eighteenth examples, a method of fabricating an integrated circuit (IC), the method comprises receiving a wafer with a planar metallization layer, depositing an I-line sensitive photoresist over the metallization layer, and performing an initial alignment to features underlying the metallization layer with infrared (IR) illumination through a backside of the wafer. The method comprises raster scanning a first pattern with maskless I-line digital light processing (DLP) lithography, exposing alignment features by etching through the metallization layer according to the first pattern, and defining a second pattern over the metallization layer with masked deep or extreme ultraviolet (UV) lithography that aligns to the alignment features.

In nineteenth examples, for any of the eighteenth examples I-line sensitive photoresist is also sensitive to the deep or extreme UV lithography.

In twentieth examples, for any of the eighteenth through nineteenth examples the first pattern comprises a polygon with a lateral dimension of at least 100 µm and a pixel size of at least 1 µm².

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) die, comprising:
   a level of interconnect features with nanometer dimensions and comprising metallization; and
   a lithography alignment feature within a second level of the IC die below the level of interconnect features; and
   a reveal window polygon within which the metallization is absent, wherein:
   a perimeter edge of the reveal window polygon has micrometer pixelation;
   the reveal window polygon is coplanar with the level of interconnect features; and
   the perimeter edge of the reveal window polygon surrounds the lithography alignment feature.

2. The IC die of claim 1, wherein the perimeter edge of the reveal window polygon comprises a plurality of pixels having a lateral dimension of at least 1 µm.

3. The IC die of claim 2, wherein the perimeter edge of the reveal window polygon comprises one or more stitching errors of at least one pixel in magnitude; and
   one pixel has an area of at least 1 µm².

4. The IC die of claim 1, wherein:
   the perimeter edge of the reveal window polygon has a lateral dimension of at least 100 µm;
   the interconnect features are interconnect lines comprising a metal; and
   the lithography alignment feature has nanometer dimensions.

5. The IC die of claim 4, wherein the metal is Cu, W, Ti, Co, Ru, Mo, Ir, Rh or Pt.

6. The IC die of claim 1, wherein:
   misregistration of the interconnect features to features within the second level of the IC die is substantially the same as misregistration of the interconnect features to the alignment feature; and the IC die further comprises a registration feature coplanar with the alignment feature, and wherein the reveal window polygon also surrounds the registration feature.

7. A computer system, comprising:
a power supply; and
the IC die of claim 1.

8. The IC die of claim 1, wherein the pixelation comprises a scan line stitching error along a first dimension of the reveal window polygon, the scan line stitching error comprising a lateral jog within a second dimension, perpendicular to the first dimensions, of at least 1 μm in magnitude.

9. The IC die of claim 8, wherein a first edge of the reveal window polygon comprises a first lateral jog that is in a first direction along the second dimension and a second edge of the reveal window polygon, parallel to the first edge, comprises a second lateral jog that is in a second direction, opposite the first direction.

10. The IC die of claim 9, wherein a magnitude of the first lateral jog is substantially the same as a magnitude of the second lateral jog.

11. The IC die of claim 8, wherein the perimeter of the reveal window polygon is rectilinear and the pixelation comprises more lateral jogs along a first perimeter edge of the reveal window polygon than along a second perimeter edge of the reveal window polygon, orthogonal to the first perimeter edge.

12. The IC die of claim 8, wherein the reveal window polygon is non-rectilinear, comprising a first perimeter edge orthogonal to a second perimeter edge, and a third perimeter edge intersecting the first and second perimeter edges, and wherein the third perimeter edge comprises a plurality of pixelated steps.

13. The IC die of claim 1, wherein the perimeter edge of the reveal window polygon comprises the metallization.

14. The IC die of claim 1, wherein the perimeter edge of the reveal window polygon extends into a dielectric material below the level of interconnect features by a first depth and a recess between the metallization features extends into the dielectric material by a second depth, different than the first depth.

15. The IC die of claim 14, wherein the first depth is deeper than the second depth.

16. An integrated circuit (IC) die, comprising:
a dielectric material;
a level of interconnect features over the dielectric material, the interconnect features with nanometer dimensions and comprising metallization; and
a lithography alignment feature within a second level of the IC die below the level of interconnect features; and
a reveal window polygon within which the metallization is absent, wherein:
a perimeter edge of the reveal window polygon has micrometer lateral pixelation and defines a recess within the dielectric material; and
the perimeter edge of the reveal window polygon surrounds the lithography alignment feature.

17. The IC die of claim 16, wherein the perimeter edge of the reveal window polygon extends into the dielectric material by a first depth and a recess between the metallization features extends into the dielectric material by a second depth, different than the first depth.

18. The IC die of claim 17, wherein the first depth is deeper than the second depth.

19. The IC die of claim 16, wherein the perimeter edge of the reveal window polygon also comprises the metallization.

\* \* \* \* \*